United States Patent
Menezes

(10) Patent No.: US 7,560,641 B2
(45) Date of Patent: Jul. 14, 2009

(54) THIN FILM SOLAR CELL CONFIGURATION AND FABRICATION METHOD

(75) Inventor: Shalini Menezes, 722 Rushing Creek Pl., Thousand Oaks, CA (US) 91360

(73) Assignee: Shalini Menezes, Thousand Oaks, CA (US)

(*) Notice: Subject to any disclaimer, the term of this patent is extended or adjusted under 35 U.S.C. 154(b) by 825 days.

(21) Appl. No.: 10/460,872

(22) Filed: Jun. 14, 2003

(65) Prior Publication Data

US 2003/0230338 A1    Dec. 18, 2003

Related U.S. Application Data

(60) Provisional application No. 60/431,268, filed on Dec. 6, 2002.

(51) Int. Cl.
*H01L 31/00* (2006.01)

(52) U.S. Cl. .................. 136/264; 136/262; 136/265

(58) Field of Classification Search ............... 136/243, 136/262, 264, 265
See application file for complete search history.

(56) References Cited

U.S. PATENT DOCUMENTS

| | | | |
|---|---|---|---|
| 4,601,960 A | 7/1986 | Menezes et al. | |
| 5,286,306 A * | 2/1994 | Menezes | 136/249 |
| 5,356,656 A | 10/1994 | Kuo et al. | |
| 6,117,703 A | 9/2000 | Penndorf | |
| 6,228,243 B1 * | 5/2001 | Menezes | 205/170 |
| 6,310,281 B1 | 10/2001 | Wendt et al. | |
| 6,372,538 B1 | 4/2002 | Wendt et al. | |
| 6,429,369 B1 | 8/2002 | Tober et al. | |
| 6,441,301 B1 | 8/2002 | Satoh et al. | |
| 6,509,204 B2 | 1/2003 | Campbell | |
| 6,562,702 B2 * | 5/2003 | Yagi | 438/483 |

OTHER PUBLICATIONS

S. Menezes et al., "A Thin Film Solar Cell Based on the CuIn3Se5 Ordered Vacancy Compound", First WCPEC, p. 361-364. (1994).*
S. Menezes, "Novel approach to CuInSe2-based thin film photovoltaic cells", Appl. Phys. Lett. 61 (13) 1564-1566. (1992).*
Joseph, M. et al, "p-Type Electrical Conduction in ZnO Thin Films by Ga and N Codoping". Jpn. J. Appl. Phys. 38, L1205-L1207. (1999).*
S. Menezes, Applied Physics Letters, 1984, 148, 54, USA.
J. Kessler, D. Schmid, R. Shaffler, H.W. Schock, S. Menezes, 23rd IEEE PVSEC, 1993, Louisville.
S. Menezes, Applied Physics Letters, 1992, 1564, 61, USA.

* cited by examiner

Primary Examiner—Jeffrey T. Barton

(57) ABSTRACT

A new photovoltaic device configuration based on an n-copper indium selenide absorber and a p-type window is disclosed. A fabrication method to produce this device on flexible or rigid substrates is described that reduces the number of cell components, avoids hazardous materials, simplifies the process steps and hence the costs for high volume solar cell manufacturing.

23 Claims, 7 Drawing Sheets

THIN FILM SOLAR CELL CONFIGURATION AND FABRICATION METHOD

CROSS-REFERENCE TO RELATED APPLICATIONS

A provisional Patent Application No. 60/431,268, entitled "Flexible Solar Cell Configuration and Fabrication Method" was filed on Dec. 6, 2002 with the US Patent and Trademark Office.

An Invention Disclosure entitled "New Approach and Configuration for a Low Cost Flexible CIS Thin film Solar Cell" conceived by Dr. Shalini Menezes was documented and witnessed on Jun. 29, 2000.

STATEMENT REGARDING FEDERALLY SPONSORED RESEARCH OR DEVELOPMENT

This invention was partly reduced to practice with Government support under a SBIR grant awarded by NSF and an EISG grant awarded by the California Energy Commission. The Government has certain rights in the invention.

REFERENCE TO SEQUENCE LISTING, A TABLE, OR A COMPUTER PROGRAM LISTING COMPACT DISK APPENDIX

Not applicable.

BACKGROUND OF THE INVENTION

The invention relates to the field of thin film photovoltaic (PV) technology. PV devices use sunlight to generate clean, reliable electric power without the environmental problems of fossil fuels or nuclear power. For such PV cells to become a serious and economically attractive alternative energy, they need to be provided in a suitable form in large quantities and made by relatively low-cost processes, using fairly inexpensive raw materials.

The copper indium diselenide (CIS) thin-film PV cell combines excellent efficiencies and long-term stability with low cost potential. The state-of-the-art CIS PV technology uses a p-type copper indium gallium diselenide (p-CIGS) absorber layer. The p-CIGS device typically uses Mo/p-CIGS/n-CdS/ZnO/metallization layers sandwiched between two rigid, fragile and heavy glass panels. This device could be also produced in a flexible configuration, whereby a single metal foil or plastic substrate replaces the two glass panels of conventional rigid modules.

Flexible, lightweight solar cells offer distinct advantages over the latter. They are amenable to monolithic roll-to-roll processing on continuous metal foils. These cells require no grid for current collection, they can be ultra thin (<100 $\mu$m), lighter and less fragile than rigid glass modules. They may be bent for manufacturing flexible solar panels. Since they mitigate much of the balance-of-system costs (frames, etc.), they have potentially low material and production costs. These aspects of flexible cells that reduce the weight, fragility and balance-of-system costs allow them to work in many non-utility applications, such as electric vehicles, building-integration and mobile systems. They can provide higher specific power ratings for space applications.

U.S. Pat. No. 5,356,656, No. 6,509,204 and the included references describe different aspects of fabricating amorphous Si solar cells. They describe a roll-to-roll method for depositing solar cell on a polymer film substrate. Amorphous Si solar cells are now routinely produced on flexible metal or metal-coated polymer substrates. U.S. Pat. No. 6,310,281, No. 6,372,538, No 6,429,369 and No. 6,441,301 adapt the flexible PV cell structure and the roll-to-roll method for fabrication of CIGS thin-film modules. The roll-to-roll type process offers a continuous-motion, high volume production. However, the current methods available for CIGS deposition use mainly vapor phase methods, which are complex, hazardous and extremely expensive. They require multi-source nozzles, chambers and vapor-creating systems. They use very high temperature, which precludes deposition of CIGS on temperature sensitive polymer substrates.

Roll-to-roll deposition method is widely used in the electroplating and electromachining industry. It is thus amenable to mass-producing CIS cells inexpensively. U.S. Pat. No. 6,117,703 adopts the electrodeposition approach for deposition of a $CuInS_2$ absorber based PV cell. Despite a solar-matched bandgap the $CuInS_2$ absorber has been inherently of a lower PV efficiency relative to the CIGS absorber. The $CuInS_2$ material has not demonstrated good PV performance even when produced by the more expensive vapor deposition techniques or in single crystal form. The presence of many secondary phases also impacts the device stability.

U.S. Pat. No. 6,429,369 proposes to use the electrochemical method for deposition of p-CIGS cell. Adapting the electrodeposition approach to the more efficient p-CIGS absorber to produce a cost effective flexible cell configuration poses many technical and economical challenges: (a) the p-CIGS device requires a sputtered Mo layer or Mo-foil contact, which is too expensive for large-scale terrestrial applications; (b) CIGS electrodeposition on Mo coated metal substrates requires a conducting diffusion barrier between Mo and the metal; (c) the co-electrodeposition of Ga, S and Na with Cu, In and Se is extremely difficult: many of these elements have to be added by vapor deposition. These additional materials and process steps complicate the fabrication process and add higher costs. The need for chemical bath deposition of a CdS buffer layer and KCN etch for the CIGS and $CuInS_2$ based PV cells further add to the hazards and the waste disposal expense.

U.S. Pat. No. 6,228,243 B1 describes a molecular layer electrodeposition (MLE) method to create high quality semiconductor thin films using a thin layer flow cell. This approach, controlled at molecular level, entails the successive electrodeposition of monolayers of a compound from a single electrolyte to form a superlattice.

U.S. Pat. No. 4,601,960 describes the fabrication of n-copper indium selenide (n-CIS) based photoelectrochemical cell and the electrochemical formation of a p/n heterojunction. Menezes demonstrated over 12% efficiency for an n-CIS single crystal cell in a photoelectrochemical configuration. U.S. Pat. No. 5,286,306 adapts the heterojunction formation approach described in U.S. Pat. No. 4,601,960 to make a solid-state n-CIS thin-film cell. The invention of U.S. Pat. No. 5,286,306 could only be partially reduced to practice because a reliable deposition method for the n-CIS thin film and a suitable front contact were unavailable. Light-blocking metallization was used to make the front contact to the device, which impeded its energy conversion efficiency assessment. The n-CIS thin film device could eliminate many of the difficulties encountered with the p-CIGS and $n-CuInS_2$ devices, if a viable device configuration, based on a wider bandgap absorber and a viable manufacturing method were devised for high volume production.

Accordingly, besides the objectives and advantages of my previous U.S. Pat. Nos. 5,286,306 and 6,228,243 B1, the main objectives and advantages of the present invention are related to the design of (a) a new thin-film PV solar cell configuration that:
  is inexpensive, safe and simple to manufacture in high volume
  eliminates the complex processing, toxic and expensive components of the CIGS solar cell, but retain its optimal PV properties
  minimizes the number of device components,
  and (b) a new fabrication method that
  is simpler and cheaper than the state-of-the-art
  uses fewer processing steps
  low temperature processing
  specifically avoids hazardous materials and processing steps
  can be made on flexible metal or polymer substrates in a continuous roll-to-roll process
  adapts to rigid substrates, bifacial illumination and superstrate configurations.

BRIEF SUMMARY OF THE INVENTION

The present invention is a solar cell, constructed with an n-CIS absorber material on a flexible or a rigid substrate to achieve the above and other objectives and advantages. The n-CIS invention requires fewer cell components than the p-CIGS cell and uses simple, mostly electrochemical fabrication. The absorber layer in the present n-CIS invention is an In-rich ordered defect chalcopyrite (ODC) compound with a wider bandgap than the previous n-CuInSe$_2$ absorber layer described in U.S. Pat. Nos. 4,601,960 and 5,286,306. The n-CIS absorber material is selected from $(Cu_2Se)(In_2Se_3)_{n+1}$ group of compounds, where n is an integer. In-rich ODC compositions are produced when n>1. These materials offer consistent n-type conductivity and self stabilizing compositions. The n-CIS device may be constructed by sequential deposition of the n-CIS absorber, a p-CuXSe$_3$ buffer and a wide gap p-CuX window on a metal or polymer foil, where X is a Group VII halide such as Cl$^-$, Br$^-$, I$^-$ or a pseudo halogen such as (SCN)$^-$, (CN)$^-$. A typical device solar cell configuration is as foil/n-CIS/p-CuISe$_3$/p-CuI. A transparent conducting oxide (TCO) layer or a metal current collector and an antireflection coating may be provided to complete the device. This cell can also be constructed in superstrate and bifacial configurations, which may be useful for constructing high efficiency multifunction cascade or tandem cell devices.

The cell configuration is suitable for either flexible foil based or rigid glass based module fabrication. The flexible cell configuration is amenable to continuous roll-to-roll electrodeposition on inexpensive metal foils.

The n-CIS PV device can eliminate the complexity and expense associated with the deposition and synthesis of the quaternary CIGS or higher order (CIGS+sulfur) compound and its expensive Mo contact layer. It eliminates the toxic CdS deposition and KCN etch. Reducing the number of cell components and processing steps can produce an ultra-simple, low-cost n-CIS PV cell that can be readily scaled for mass production.

DRAWINGS

Reference Numerals

Figure 1:
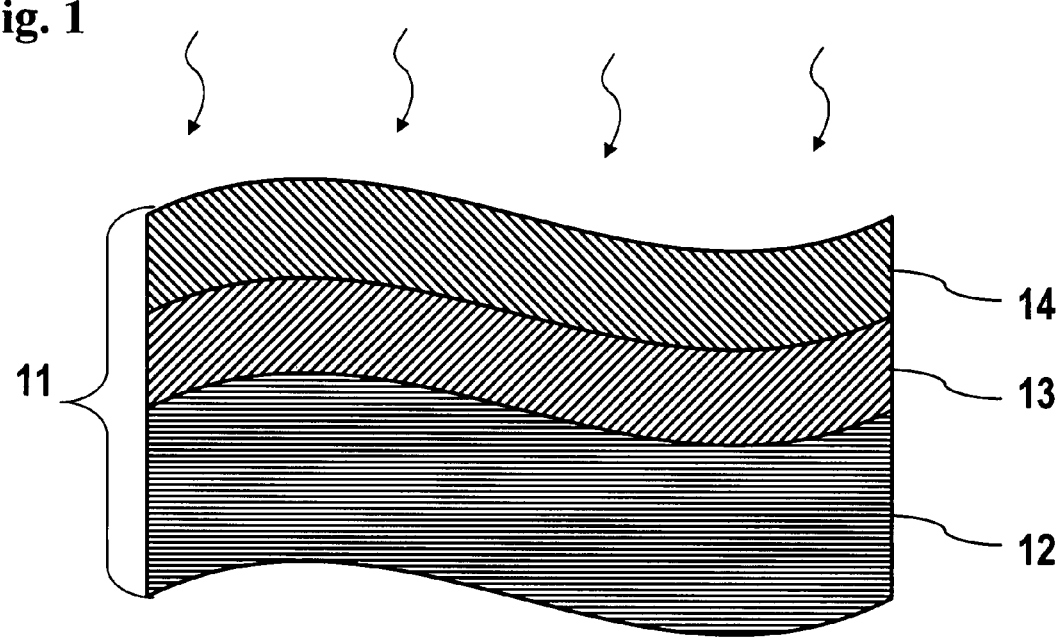
FIG. 1 is a cross-sectional view of the flexible n-CIS solar cell components made in accordance with the present invention comprising a conductive substrate, an n-CIS absorber layer, a p-window layer and a top current collector.

| DRAWINGS-Reference Numerals | |
| --- | --- |
| 11 | PV Cell |
| 12 | Substrate |
| 13 | n-Cis |
| 14 | p-window |
| 15 | Current collector |
| 16 | Anti-reflection coating |
| 17 | p-CuXSe$_3$ |
| 18 | p-CuX |
| 19 | TCO |
| 20 | Cu/In/Se electrolyte |
| 21 | Cu$_x$Se |
| 22 | CuI/I$^-$/I$_2$/HI electrolyte |
| 23 | Cu/I$^-$ electrolyte |
| 24 | Thin layer flow cell |
| 25 | Potentiostat |
| 26 | Computerized control system |
| 27 | Solenoid distribution valve, |
| 28 | Peristaltic pump |
| 29 | Solution reservoir |
| 30 | Waste reservoir |

DETAILED DESCRIPTION OF THE INVENTION

This invention adapts the n-CIS/p-CuISe$_3$ heterojunction formation concept, described in U.S. Pat. No. 5,286,306 to a practical device that can be mass-produced for a wide range of applications. U.S. Pat. No. 5,286,306 is hereby incorporated by reference for its teachings to make an n-CuInSe$_2$ based thin-film cell. This invention describes a new low-cost method to produce an n-CIS absorber layer on flexible substrates and subsequent process steps to fabricate the relevant cell components. It combines the electrochemical n-CIS/p-CuISe$_3$ heterojunction formation concept with new materials and processes, such as: (I) flexible substrate, (II) roll-to-roll fabrication (III) electrodeposition for n-CIS, (IV) ODC absorber layer, (V) electrodeposited Cu-halide or pseudo-halide window and (VI) TCO front contact.

Figure 2A:
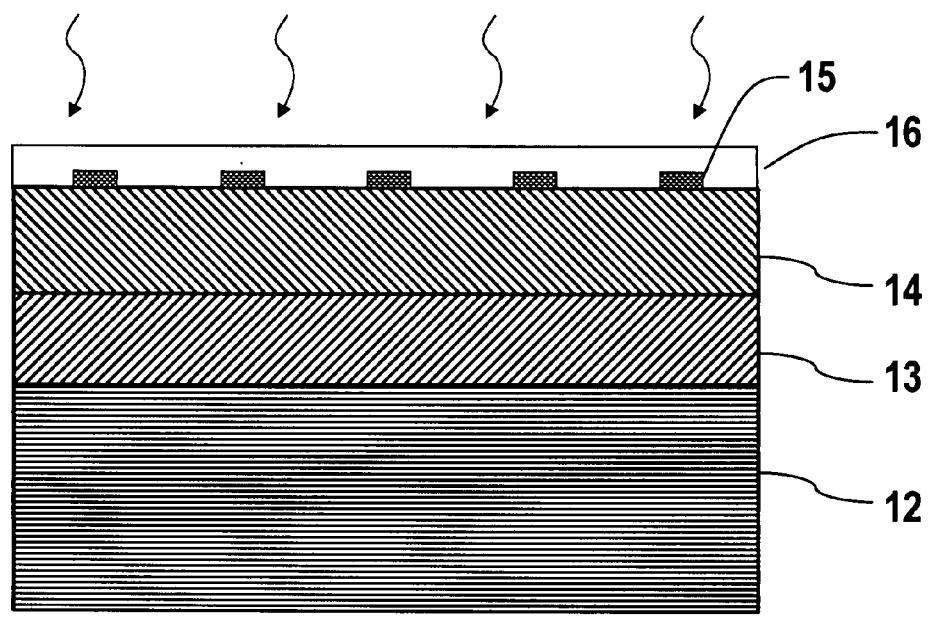
FIG. 2 shows a cross-sectional view of the rigid n-CIS solar cell components in (A) substrate, (B) superstrate, and (C) bifacial configurations, made in accordance with the present invention comprising a conductive substrate, an n-CIS absorber layer, a p-window layer, a top current collector and an antireflection coating.
Figure 2B:
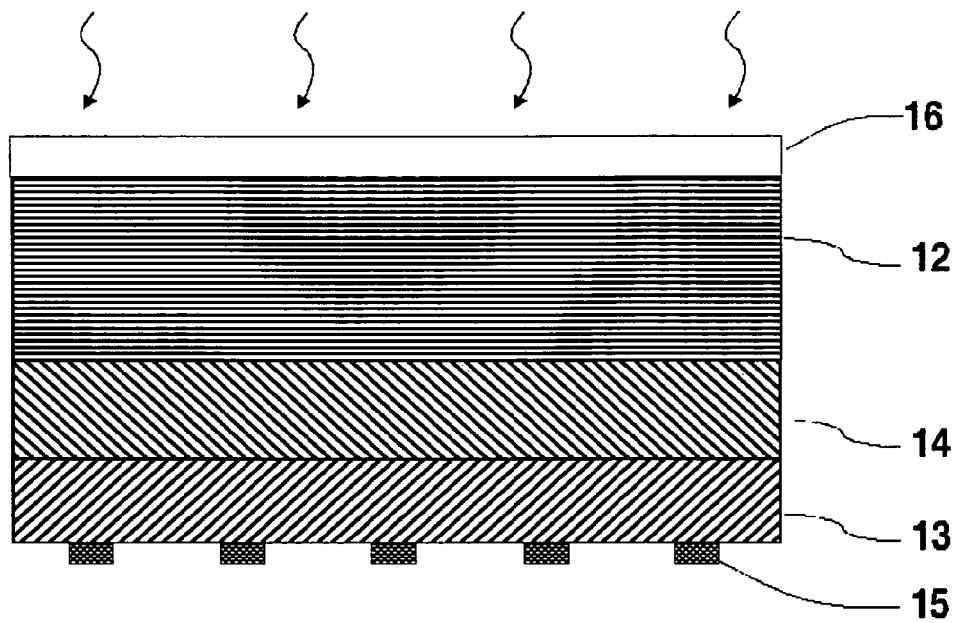
Figure 2C:
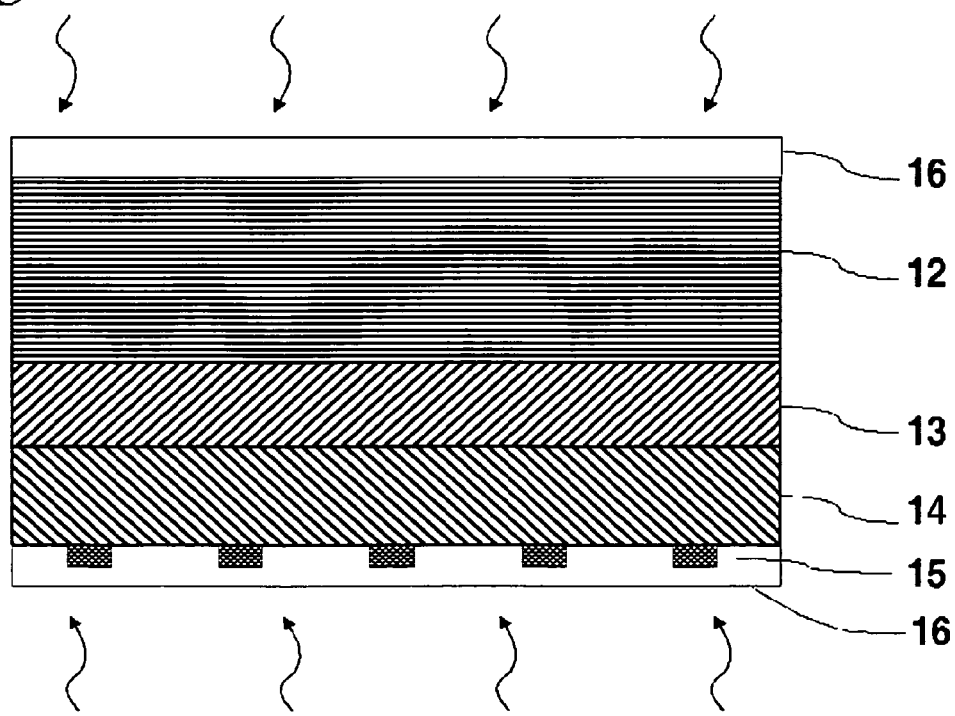

FIG. 1 shows a basic configuration of a flexible n-CIS solar cell 11 made in accordance with the present invention. It comprises a substrate 12 on which the n-type CIS absorber film 13 is deposited. A p-type window layer 14 is formed on the n-type absorber film 13 through which sunlight enters the device. FIG. 2A shows another version of the n-CIS solar cell 11 constructed on a rigid substrate 12 such as glass, coated with suitable conducting material such as indium tin oxide (ITO). The glass and the ITO constitute the substrate 12. The device is completed by depositing the n-CIS absorber film 13, followed by the p-type window layer 14. A current collector 15 and an antireflection coating 16, may be deposited on the window layer 14, as needed to enhance the device performance or to assemble the flexible cells of FIG. 1 into modules. FIG. 2B shows a superstrate structure for the same cell. In this version the window layer 14 is deposited on a transparent substrate 12 coated with a transparent conductor. The n-CIS absorber layer 13 is deposited over the window layer. A current collector 15 is deposited on the absorber layer 13. The antireflection coating 16 may be deposited on the outer surface of the substrate 12. FIG. 2C shows another version of the n-CIS cell that allows bifacial illumination. In this device, the current collectors in the substrate 12 and the window 14 layer are transparent, so that the light can enter the device from the top and the bottom surfaces to permit bifacial illumination. Further the cells in FIGS. 1, 2A, 2B and 2C may be combined with other solar cells or light absorbing materials to produce high efficiency multijunction cascade devices or tandem cells.

A variety of materials can be used to provide the components of the devices depicted in FIGS. 1 and 2. For example, the substrate 12 can be rigid or flexible, conductive or insulating, transparent or opaque. The substrate 12 may combine two materials such as a backing material sub-layer and a conducting layer. Possible substrate materials include, but are not limited to, sheets or flexible foils of insulating sub-layers such as glass, alumina, mica or polyimide materials, or conductive materials such as Cu, stainless steel, Mo, W, Ta, Ti, Al, Ni, graphite and alloys of various metals. The coating layer if used, is made of a conductive material that provides good ohmic contact to the n-CIS semiconductor absorber film 13, like ITO, and serves as the bottom current collector 15. Other materials with high work function such In, Ta, Ti, Mo, Ga, Al, Zn, Sn, Au, Cu, W and their alloys and compounds may be used as conductive coating layers. The conductive layer is not needed if the sub-layer 12 is a conductive material that can provide good ohmic contact to the n-CIS absorber film 13. A transparent substrate 12 comprising glass or plastic coated with a transparent conductor is needed for the bifacial illuminated device shown in FIG. 2C.

The n-CIS absorber layer 13 is the key component of the solar cell invention. The n-CIS material may be selected from the $(Cu_2Se)(In_2Se_3)_{n+1}$ ODC compounds, where n is an integer=0, 1, 2, 3 . . . The In-rich stoichiometries in this series, i.e. when n>0, provide more attractive absorber materials than the $CuInSe_2$. The ODC compounds provide a large window of stoichiometries that are consistently n-type. Whereas the $CuInSe_2$ phase can switch easily from n-type to p-type, the ODCs have distinct self-stabilizing compositions that tolerate variations in deposition parameters. Kessler et al show that this feature leads to smooth, dense, homogenous films. The ODCs include the n-$CuSe_3In_5$ semiconductor, which offers a higher, solar matched direct optical gap of 1.3 eV. This avoids the need for Ga or S for bandgap engineering that is required with the current p-CIGS absorber.

Figure 3:
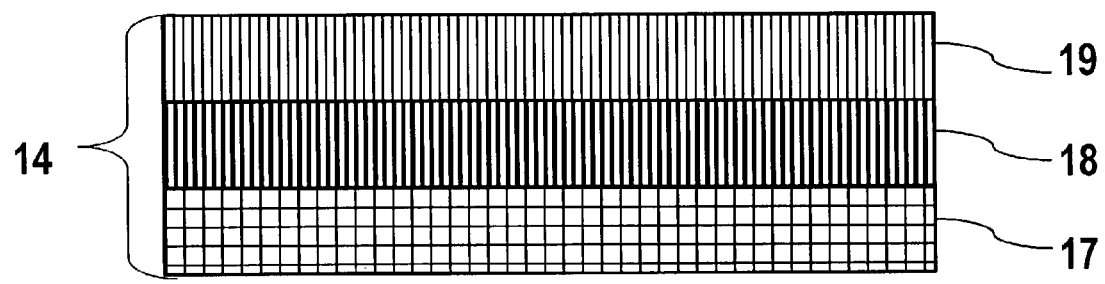
FIG. 3 is a cross sectional view of the components that may comprise the window layer.

The p-type layer 14 is constructed on top of the absorber 13. FIG. 3 shows a substructure of the window layer 14. The window layer 14 may comprise combinations of $CuXSe_3$ 17, CuX 18 and TCO 19 layers. For example in the preferred embodiment, where X is iodide, the window layer may include either $CuISe_3$/CuI, $CuISe_3$/TCO or $CuISe_3$/CuI/TCO substructure. The $CuISe_3$ 17 layer is constructed from the CIS 13 lattice to create an intermediary $CuIn_xSe_yI$ interfacial layer that is perfectly lattice-matched to the CIS absorber 13. This avoids interface recombination in the critical space charge region, leading to higher PV efficiency. A CuI layer 18, which is a p-type semiconductor with a bandgap>3 eV, can be deposited directly on the n-CIS 13 or the intermediary $CuISe_3$ 17 layer. Both $CuISe_3$ 17 and CuI 18 lead to a transparent and textured surface that is conducive to light trapping and hence higher device efficiency. Other halogens and pseudo-halogens may be substituted for the iodide in $CuXSe_3$ 17, and the CuX 18 layers. The window layer 14 may include CuBr, CuCN, CuSCN, ZnO, $ZnSnO_2$ and other transparent conducting materials. A TCO layer 19 may be deposited on either the $CuXSe_3$ 17 or the CuX 18 layers. The p-type TCO 19 e.g., $ZnSnO_2$ with a low work function ($\equiv -5.3$ eV) is the preferred material for a low-resistance front contact to the device. Alternate TCOs include ZnO. The ZnO layer may be double-doped with nitrogen and a group III metal. A double layer of i-ZnO and n-ZnO TCO may also be used.

The front current collector 15 may be deposited with an e-beam system or other techniques. It may comprise a bilayer, such as 500-1000 Å thick Ni and a 1-3 µm thick Al. Metal contacts 15 will generally be laid out in fine grid lines across the collecting surface of large area devices and connected to a suitable current collecting electrode 15. Flexible solar cell strips generally use roof tile interconnection to avoid the need for a metal current collector. Adding an antireflection coating 16, such as a 600-1000 Å layer of $MgF_2$ by electron beam, can further increase the efficiency of the resulting device.

The semiconductor components of the n-CIS PV cell in FIG. 1 can be deposited by a variety of methods. The n-CIS absorber layer 13 may be deposited by any of the conventional methods used for the corresponding p-CIGS absorber, such as co-evaporation, molecular beam epitaxy, chemical vapor deposition, magnetron sputtering, oxide paste ink coating, chemical bath deposition and electrodeposition. The latter four approaches usually require a second selenization step either by thermal evaporation or with $H_2Se$ gas. Electrodeposition is the preferred method of this invention because it presents several processing and cost advantages over other deposition methods, particularly for economical high-volume roll-to-roll manufacturing of solar cells.

The electrodeposition of n-CIS 13 may proceed over a range of process parameters. It may include single step deposition or a combination of sequential steps involving the deposition of Cu, In, Se metal, In-Cu, In-Se, Cu-Se binary and Cu-In-Se ternary precursors. For example alternate methods for CIS deposition may include: (i) deposition of $In_2Se_3$ on Cu foils (ii) deposition of ternary $CuInSe_2$ on non-Cu foils, or (iii) deposition of Cu-In alloy and then $Se_1$ on Mo foils. The plating electrolyte 20 contains dissolved ions of each of the elements of Cu, In and/or Se needed to produce the desired composition. For ternary deposition the concentration ratios of Cu:In:Se ions may be in the range of 1:1-20:1-20 to produce the desired composition of an ODC compound. The solution pH may be adjusted between 1.0-4.0, preferably to about 2, and solution temperature between 20°-80° C. A supporting electrolyte containing salts of chloride, sulfate, nitrates or perchlorates may be added to increase the conductivity of the plating solution. Alternately an organic solvent may be used instead of aqueous solutions. Buffer solutions, surfactants and complexing agents may also be added to improve the morphology. The deposition may take place at a constant potential or pulsed potential. The potential range of −0.4 to −1.4V is preferred for one step deposition. The n-CIS 13 layer preferably has a thickness of 1-3 µm.

Figure 4:
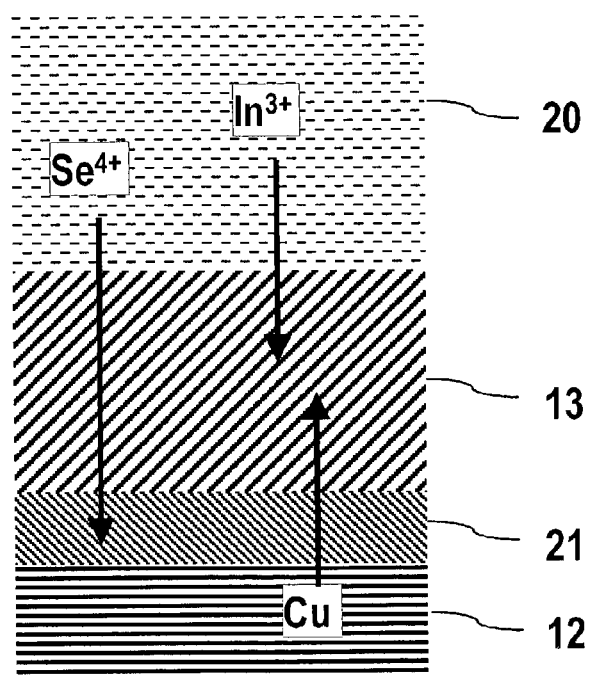
FIG. 4 illustrates the sequential growth of CuSe and CIS phases during Se and In reduction on Cu foil.

The type of substrate 12 changes the growth and morphology of the electrodeposited CIS 13 film. The CIS 13 formed on Cu foil 12 exhibit significantly better crystallinity, less strain and large grain size relative to the CIS deposited on steel substrates 12. The higher crystallinity is attributed to the formation of a $Cu/Cu_xSe/CIS$ structure. The schematic of FIG. 4 illustrates the sequential growth of a $Cu_xSe$ phase 21 such as, $Cu_5Se_4$ and a CIS 13 phase during the co-reduction of Se and In on Cu foil. The sequential deposition of In and then Se may decrease the $Cu_xSe$ 21 content in the CIS 12 film. However, the $Cu_5Se_4$ 21 underlayer presents a more ideal surface to nucleate higher quality CIS 13 relative to direct ternary CIS formation on other metal substrates 12. The $Cu_5Se_4$ is large-grained and is very well matched to the (112) lattice spacing of $CuInSe_2$.

Figure 5:
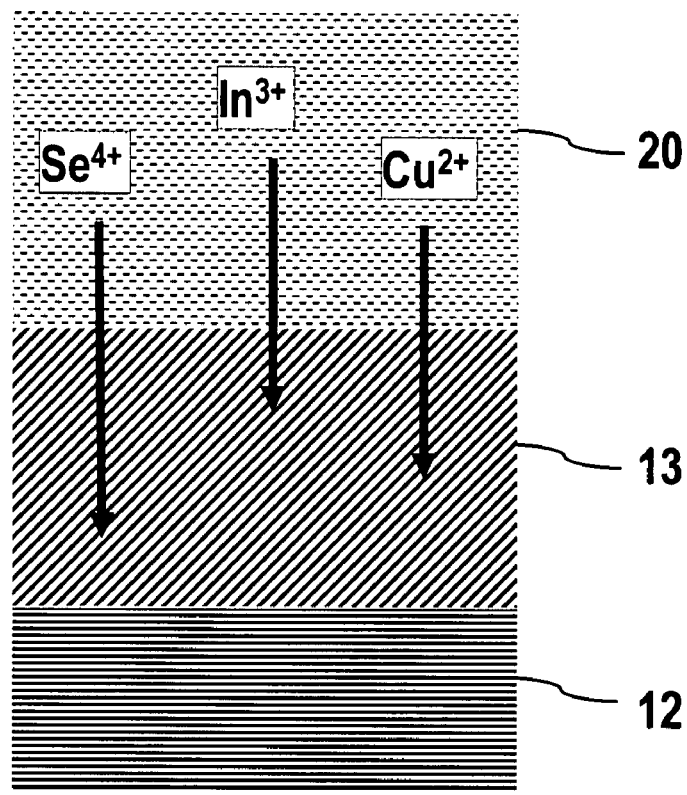
FIG. 5 illustrates co-deposition of Cu, In and Se to produce a CIS film on a non-Cu substrate.

On a non-Cu substrate 12, the CIS film can be produced by co-deposition of Cu, In and Se, FIG. 5. The CIS deposition may proceed via one-step ternary compound deposition, via sequential deposition of each element on the substrate, via sequential deposition of binary phases, e.g., $CuIn_x$, CuSe and $In_2Se_3$, or via combination of elemental, binary and ternary phases, e.g. Cu followed by $In_2Se_3$. The CIS film may be subjected to post deposition anneal to improve the crystallinity and the grain size. The heat treatment may be carried out at temperatures between 200°-650° C. using a rapid thermal processing or conventional oven in a selenium or inert gas (argon, nitrogen) atmosphere.

Figure 6:
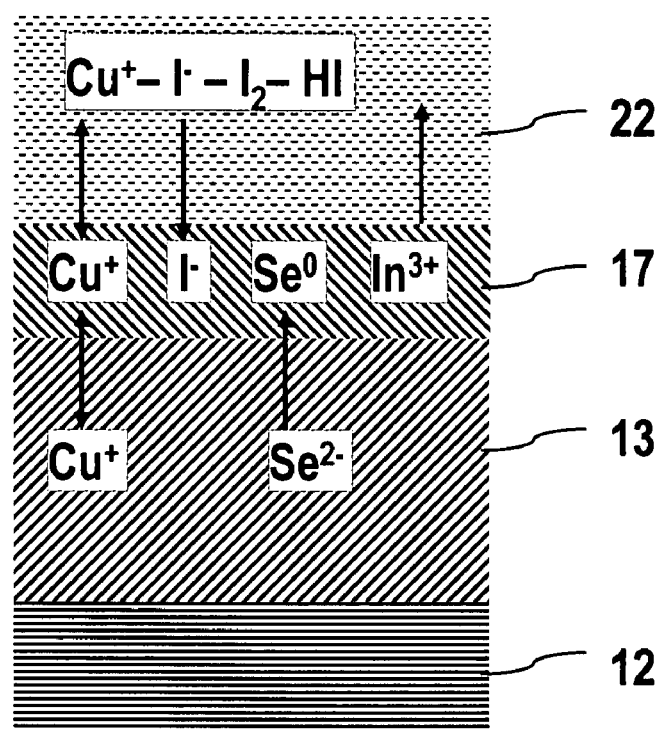
FIG. 6 illustrates n-CIS/p-CuISe$_3$ heterojunction formation by reacting the CIS surface with CuI$^-_n$.

FIG. 6 illustrates n-CIS/p-$CuISe_3$ heterojunction formation. The $CuISe_3$ 17 is synthesized by an electrochemical reaction of the n-CIS 13 surface in an acidic $I^-/I_2/CuI/HI$ electrolyte 22. This post deposition procedure involves brief anodic oxidation of the n-CIS film electrolyte 22 as described in U.S. Pat. No. 5,286,306. It can also be formed by immersing the CIS film 13 in the electrolyte 22 for a period between a few seconds to several minutes. The surface reaction leads to a lattice matched $CuIn_xSe_yI$ and a transparent p-$CuISe_3$ 17 heterojunction partner for n-CIS 13. It produces a clean p/n heterointerface with low interface state density and a textured surface that is conducive to light trapping.

Figure 7:
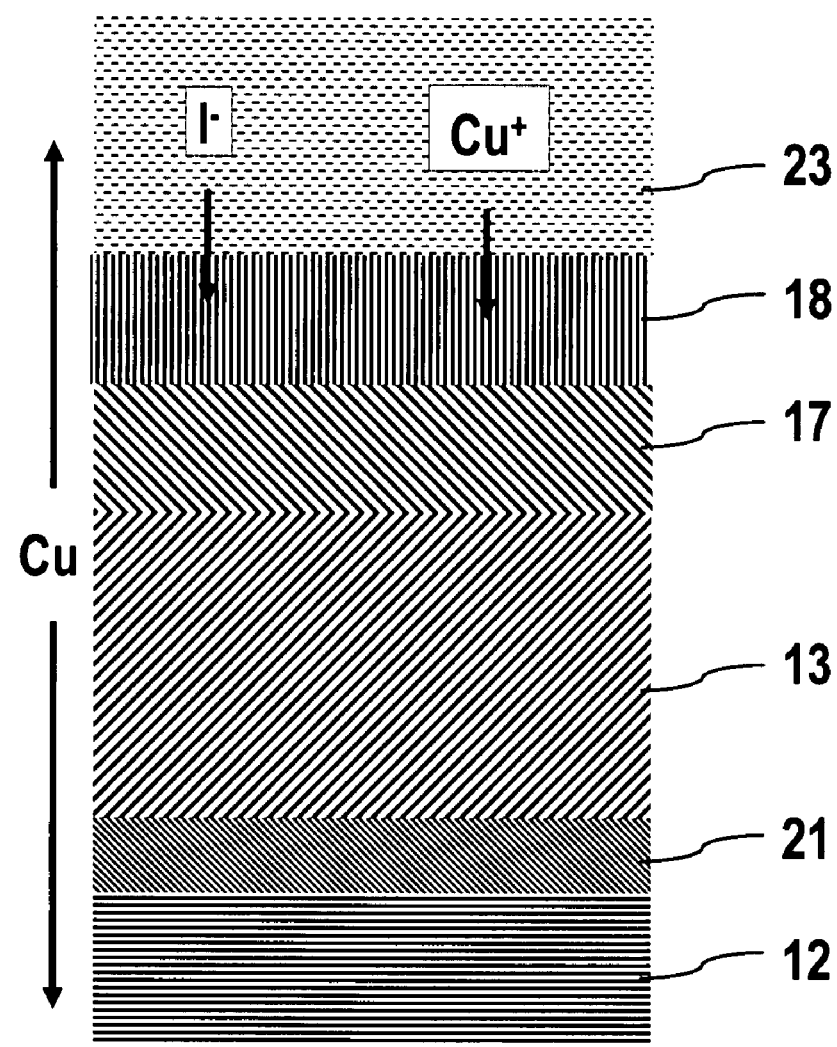
FIG. 7 illustrates Cu/n-CIS/p-CuISe$_3$/p-CuI formation by depositing CuI layer on the n-CIS/p-CuISe$_3$.

The CuI layer 18 may be deposited by any conventional methods, such as spray pyrolysis, chemical or vacuum deposition. This invention teaches an electrodeposition method. CuI may be deposited from a $Cu^+-I_2-I^-$ system 23 around −0.25V vs. SCE. Solid CuI can be deposited both cathodically and anodically. Its formation as a white film on the electrode surface can be visually monitored. CuI forms by a cathodic reduction of $Cu^2$ and $I_3^-$ at a considerably more positive potential than the thermodynamically predicted value. Due to its low solubility, the solid CuI passivates the electrode surface. CuI decomposes at more negative potential, generating $I^-$ and Cu. The anodic oxidation of Cu in $I^-$ also initially produces a light translucent CuI film, which then changes to a thick white film at more positive potentials. FIG. 7 shows the formation of CuI 18 by electrodeposition on the p-$CuISe_3$ 17. It also shows that the cell made on a Cu foil would have no problems of Cu diffusion since Cu would be present in all the device layers. The CuI layer can also be formed by reduction and re-oxidation of any excess CuSe phase that may be present in the CIS film 13 at about 0V vs. SCE. In this case, the Cu concentration in the electrolyte 23 should be at least 20 mM to prevent the CIS film 13 decomposition. If the CIS absorber layer is very thin, the CuI may be deposited by less reactive methods, listed above, or by chemisorption of the Cu ions and the $I^-$ ions from separate solution sources. A 1-10 min anneal, preferably under $I_2$ vapor may be included to improve the electronic structure of $CuISe_3$ 17 and the CuI 18 layers. A ZnO TCO 19 can be deposited over the CuI if needed by chemical vapor deposition, sputtering or electrodeposition. Other methods or TCO 19 materials can be substituted.

Figure 8:
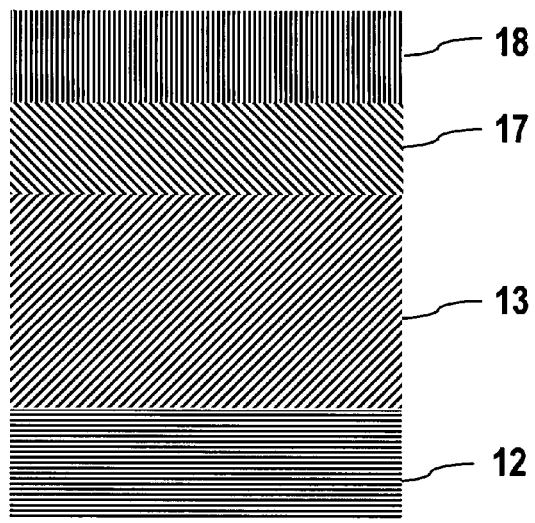
FIG. 8 shows a configuration for the n-CIS cell invention with flexible foil/n-CuIn$_2$Se$_5$/p-CuISe$_3$/p-CuI structure.

The best mode of carrying out the invention set forth in the description may be contemplated from above preamble on CIS electrodeposition, heterojunction formation and CuI deposition. FIG. 8 shows a preferred configuration for the n-CIS cell invention with flexible foil/n-$CuIn_2Se_5$/p-$CuISe_3$/p-CuI structure. The substrate 12 may be a metal, which serves as the backing and the back contact to the flexible solar cell as in FIG. 5. It may be a polymer foil coated with a conducting layer such as Mo or ITO. The n-CIS device may also be fabricated directly on a Cu substrate 12 as in FIG. 4. In that case, the Cu foil also supplies Cu ions.

Figure 9:
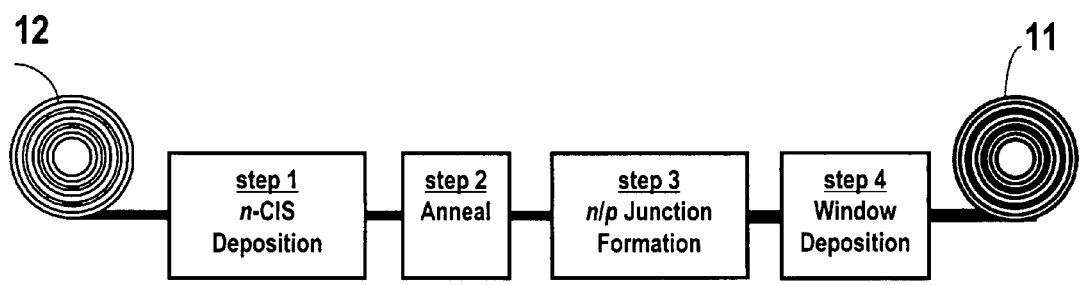
FIG. 9 shows a schematic of sequential process steps for roll-to-roll fabrication of n-CIS PV on a metal or polymer tape. Step 1 deposits the n-CIS absorber layer and is followed by a brief post deposition thermal anneal, step 2. Step 3 produces an n/p heterojunction. Step 4 deposits window component(s) to complete the cell.

The PV cell can be fabricated on continuous substrate 12 roll using a simple four-step method. For rapid, high-volume PV device fabrication, the electrodeposition of CIS 13 may proceed via commercial roll-to-roll deposition systems. Such roll-to-roll systems are well known in the art. Using this technique, large rolls of solar cells 11 may be formed on a substrate such as plastic or metal foil. These systems permit one-sided continuous coating by guiding the substrate strip over a partially submerged guide roll, in the plating bath. An anodic step to clean the substrate surface in dilute acid may precede the CIS deposition step. FIG. 9 shows an example of a method to fabricate the n-CIS PV device using roll-to-roll electrodeposition. The method involves treating a pre-cleaned Cu foil 12 with a sequence of steps (1)-(4), as depicted in FIG. 9. The 4 principal steps required to construct the Cu/n-CIS/p-$CuISe_3$/TCO cell of FIG. 1 include:

Step 1 Electrodepositing Se and In on a Cu foil 12.

Step 2 A brief thermal anneal to enhance the CIS film morphology.

Step 3 Conversion of the n-CIS 13 surface to p-$CuISe_3$ 17.

Step 4 Deposition of a window 14 layer made of CuI 18, TCO 19 and/or a metal grid 15 on the p-$CuISe_3$ 17 to complete the cell.

The n-CIS absorber 13, the p-$CuISe_3$ 17 and the window 14 or metal contact 15 are deposited sequentially. The n-CIS film may be synthesized by depositing only 2 elements (In, Se) directly on a Cu-foil. CIS deposition directly on Cu foil consolidates the substrate and back contact. It avoids the need for Cu deposition. Another mode involves synthesis of CIS in Step 1 by depositing Cu, In and Se sequentially as individual metal, alloy, binary or ternary compound layers on non-Cu substrates such as, Mo, Ti, steel, metal or TCO coated polymer foils.

The next steps comprise n-CIS flexible PV panel construction and assembly. The individual PV cells on the elongated strip may be monolithically integrated and laminated to produce a PV module, using standard assembly line procedures developed for amorphous Si and CIGS flexible cells also described in numerous US Patents. As noted in prior art, the use of roof-tile cell interconnection with overlapping along the longitudinal edges, avoids a front current collection grid. Variable cell number per string permits variable module voltage output or module current output, module length and width.

Figure 10:
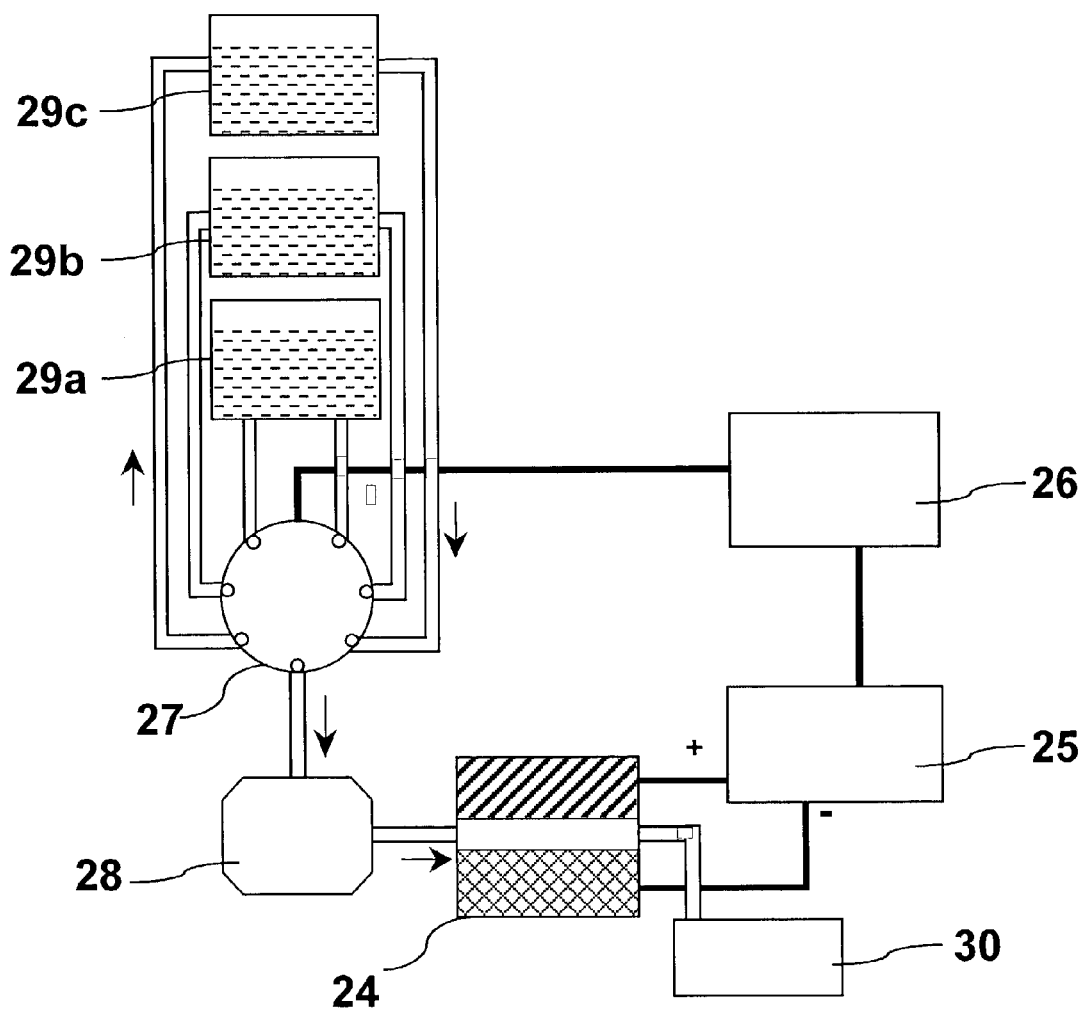
FIG. 10 shows a schematic of experimental set-up for MLE with a thin-layer flow cell comprising a potentiostat, solenoid distribution valve, peristaltic pump, solution and waste reservoirs, and a computerized control system, to synchronize solution flow and deposition.

An alternate mode for fabricating the n-CIS cell uses MLE in a thin layer flow cell as described in U.S. Pat. No. 6,228,243 B1. The teachings in this Patent are incorporated in this invention by reference. The MLE approach allows deposition of high quality films that can avoid the high temperature anneal. The n-CIS absorber 13 and the window 14 layers shown in FIGS. 1 and 2 could be sequentially deposited to produce a complete device. A thin layer flow cell 24 is the central element of the experimental apparatus, FIG. 10. This method uses a potentiostat 25 and computerized process control system 26 to synchronize the pumping, delivery, equilibration and deposition, and to monitor the deposition parameters. The sequential deposition of molecular layer for individual cell components is carried out using a solenoid distribution valve 27 and peristaltic pump(s) 28 to control the solution flow from the reservoirs 29 to the thin layer flow cell 24. The solenoid valve 27 can be programmed to successively switch to different reservoirs 29 containing the electrolytes 20, 22 and 23 to produce each of the device layers. For example, initially the valve 27 controls the flow of the solution 20 from reservoir 29a into the deposition cell to deposit the absorber layer 13. A delay time introduced after each filling equilibrates the electrolyte 20 to avoid convection effects. The deposition is performed by applying a potential pulse to produce a molecular layer of CIS under quiescent conditions to avoid the mass transport and polycrystallinity. The solution is flushed out after the deposition of each CIS molecular layer. The process is repeated until a desired thickness is attained for the absorber layer 13. The thin layer cell 24 is flushed with water from reservoir 29b. The computer then switches the solution flow to another reservoir 29c containing electrolyte 22, and programs the potentiostat for conversion of the CIS surface layer to $CuISe_3$ 17. Other reservoirs may be added as need to deposit CuI 18 or ZnO as needed by repeating the molecular layer deposition cycles using relevant electrolytes and deposition parameters. Any other TCO layers or metal grid may also be deposited with the same process, using appropriate masks.

The MLE approach has many advantages over conventional electrodeposition including the capability to: (a) co-deposit metals (In, Cu, Se) with widely disparate potentials, (b) form ultra smooth quasi-crystalline films, just by changing the geometry of the deposition chamber and (c) correct film non-stoichiometry in-situ with an anodic current pulse. The version of the n-CIS device created in the thin layer flow cell 24 is more suitable for batch production. It is especially useful for device fabrication on temperature sensitive lightweight polymer substrates needed for space power applications. However, the thin layer flow cell 24 may be adapted to the roll-to-roll system in FIG. 9 to create high quality CIS absorber layer 13. Device processing with the thin layer flow cell 24 may also be carried out chemically without applying potential or passing current. This approach can be used for CIS surface modification in $I^-/I_2/Cu^+/HI$ or the deposition of CuI using chemisorption.

The n-CIS cell configuration offers many advantages over the p-CIGS version. It can reduce the number of cell components, simplify the processing steps and lower production costs relative to the p-CIGS cell. This configuration is amenable to continuous roll-to-roll electrodeposition on inexpensive metal foils. It avoids many expensive components, processing steps and equipment that would be needed for an analogous flexible p-CIGS cell. It eliminates the hazardous KCN etch to remove CuSe, the undesirable CdS buffer layer, and the need for Ga, S, Na and a diffusion barrier between sputtered Mo and other metal substrates. Note that the co-electrodeposition of Ga, S, Na along with Cu, In and Se is extremely difficult. It is also not limited to using expensive Mo substrates. The n-CIS PV cell is a viable option for flexible devices. It offers a new thin-film PV technology for terrestrial and space applications. When optimized it could deliver high efficiency and reliability similar to that for the p-CIGS PV cell. The efficiency projections are based on previous results for n-CIS single crystal cell reported by Menezes. In addition, the n-CIS cell offers new attributes in the form of much lower cost, easier large-scale fabrication and more versatile applications. It is also totally Cd free. The n-CIS cell presents an innovative low temperature approach for production of CIS PV cells on low density polymer substrates that are suitable for integrated interconnect system. This n-CIS cell reduces the cell weight, number of components, material costs and process costs. Thus it also presents a viable method to simplify the fabrication of space based, long life, high specific power CIS solar cells.

Although the present invention described above contains much specificity, which should not be construed as limiting the scope of the invention but as merely providing illustrations of some of the presently preferred embodiments and drawings of this invention. Various adaptations and modifications of the present invention may be accomplished without departing from the spirit and the scope of the invention. The scope of the invention should be determined by the appended claims and their legal equivalents, by the above examples.

What is claimed is:

1. A photovoltaic device based on a n-doped absorber layer for converting light to electrical energy comprising
    a) said n-doped absorber layer, selected from the In-rich $(Cu_2Se)(In_2Se_3)_{n+1}$ group of n-type semiconducting compounds, where n is an integer >0
    b) a p-type $CuXSe_3$ layer, contiguous with said n-doped absorber layer, where X is selected from group VII halogens and related pseudo-halogens
    c) a window layer of p-type CuX layer, contiguous with said p-type $CuXSe_3$, where X is selected from group VII halogens and related pseudo-halogens.

2. The device of claim 1 where a substrate for said photovoltaic device comprises materials selected from transparent conducting oxides, glass, metal foils, composites, metal grids and plastic foils.

3. The device of claim 1 wherein first current collector is contiguous with said n-doped absorber layer, second current collector is contiguous with said window layer, and the two current collectors are transparent to provide bifacial illumination of said photovoltaic device.

4. The device of claim 1 where said window layer comprises layers selected from CuI, CuBr, CuCN CuSCN.

5. The device of claim 1 in a multifunction cascade or tandem configuration with other semiconductor materials.

6. The device of claim 1 in a superstrate configuration, whereby said device is illuminated through transparent superstrate, contiguous with current collector material providing ohmic contact to said window layer.

7. The device of claim 1 wherein the constituents of at least one layer are deposited in vapor phase.

8. The device of claim 1 where said n-doped absorber layer is produced from a reaction of Cu, In and Se in media selected from liquid, gas and solid phases.

9. The device of claim 8 where said n-doped absorber layer is produced by co-electrodeposition of constituents.

10. The device of claim 8 where said n-doped absorber layer is produced by sequential deposition of precursors to achieve a composition selected from said In-rich $(Cu_2Se)(In_2Se_3)_{n+1}$ group of materials, where n is an integer >0.

11. The device of claim 8 where said n-doped absorber layer is synthesized from Cu-In alloy precursor, wherein concentration ratio of Cu/In is selected to achieve compositions of said In-rich $(Cu_2Se)(In_2Se_3)_{n+1}$ group of materials, where n is an integer >0.

12. The device of claim 8 where said n-doped absorber is produced from a paste, comprising Cu, In and Se particulates, wherein a Cu:In:Se concentration ratio is selected to achieve compositions of said In-rich $(Cu_2Se)(In_2Se_3)_{n+1}$ group of materials, where n is an integer >0.

13. The device of claim 1 in which said n-doped absorber layer is formed by depositing In and Se on a flexible Cu foil.

14. The device of claim 1 wherein said absorber layer is additionally doped by elements from ohmic contact.

15. The device of claim 1 wherein said n-doped absorber layer is thermally processed.

16. The device of claim 1 where said n-doped absorber layer is deposited on a $Cu_xSe$ layer.

17. The device of claim 1 where said CuX layer is electrodeposited from a solution containing the constituent ions.

18. The device of claim 1 where said CuX layer is deposited by alternating steps of absorption of Cu ions and X ions from separate solutions.

19. The device of claim 1 wherein at least one said layer is deposited in a continuous roll-to-roll process to produce said photovoltaic device.

20. The device of claim 1 where at least one layer of said photovoltaic device is produced by molecular layer electrodeposition.

21. The device of claim 1 where at least one layer of said photovoltaic device is produced in a thin layer flow cell by a non-electrochemical process.

22. The device of claim 1 where said p-type $CuXSe_3$ layer is created by treating the surface of said n-doped absorber layer in a medium containing X species, where X is selected from group VII halogens and related pseudo-halogens.

23. A method for producing a photovoltaic device based on an n-doped absorber layer for converting light to electrical energy, comprising the steps of:

a) depositing said n-doped absorber layer, selected from the In-rich $(Cu_2Se)(In_2Se_3)_{n+1}$ group of n-type semiconducting compounds, where n is an integer >0;

b) depositing a p-type $CuXSe_3$ layer, contiguous with said n-doped absorber layer, where X is selected from group VII halogens and related pseudo-halogens; and c) depositing a window layer of p-type CuX layer, contiguous with said p-type $CuXSe_3$, where X is selected from group VII halogens and related pseudo-halogens.

* * * * *